(12) United States Patent
Yang et al.

(10) Patent No.: US 8,867,268 B2
(45) Date of Patent: *Oct. 21, 2014

(54) ACCESSING MEMORY USING REFERENCE VOLTAGES

(71) Applicant: Marvell World Trade Ltd., St. Michael (BB)

(72) Inventors: Xueshi Yang, Cupertino, CA (US); Zining Wu, Los Altos, CA (US)

(73) Assignee: Marvell World Trade Ltd. (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/848,959

(22) Filed: Mar. 22, 2013

(65) Prior Publication Data

US 2013/0229869 A1 Sep. 5, 2013

Related U.S. Application Data

(63) Continuation of application No. 12/535,987, filed on Aug. 5, 2009, now Pat. No. 8,406,048.

(60) Provisional application No. 61/087,417, filed on Aug. 8, 2008.

(51) Int. Cl.

| G11C 16/04 | (2006.01) |
|---|---|
| G11C 16/34 | (2006.01) |
| G11C 16/10 | (2006.01) |
| G11C 16/28 | (2006.01) |
| G11C 11/56 | (2006.01) |

(52) U.S. Cl.
CPC ........ *G11C 16/34* (2013.01); *G11C 2211/5634* (2013.01); *G11C 16/10* (2013.01); *G11C 16/28* (2013.01); *G11C 11/5642* (2013.01)

USPC ............ 365/185.02; 365/185.03; 365/185.24; 365/189.07; 365/189.09

(58) Field of Classification Search
USPC ............. 365/185.02, 185.03, 185.24, 189.07, 365/189.09
See application file for complete search history.

(56) References Cited

U.S. PATENT DOCUMENTS

| 7,023,735 | B2 | 4/2006 | Ban et al. | |
|---|---|---|---|---|
| 7,170,791 | B2 * | 1/2007 | Iwase et al. | ............... 365/185.22 |
| 7,463,516 | B2 | 12/2008 | Ban | |
| 2003/0126367 | A1 | 7/2003 | Revilla et al. | |
| 2003/0217323 | A1 | 11/2003 | Guterman et al. | |
| 2004/0233726 | A1 | 11/2004 | Iwase et al. | |
| 2005/0013165 | A1 | 1/2005 | Ban | |
| 2008/0075351 | A1 | 3/2008 | Smith | |
| 2008/0094907 | A1 * | 4/2008 | Ban | ......................... 365/185.21 |
| 2008/0151617 | A1 * | 6/2008 | Alrod et al. | ................ 365/185.2 |
| 2008/0250300 | A1 | 10/2008 | Mokhlesi et al. | |
| 2008/0285340 | A1 * | 11/2008 | Song et al. | ................. 365/185.2 |
| 2009/0080259 | A1 | 3/2009 | Alrod et al. | |

FOREIGN PATENT DOCUMENTS

| WO | 2008/075351 A2 | 6/2008 |
|---|---|---|
| WO | 2008/140171 A1 | 11/2008 |

* cited by examiner

*Primary Examiner* — Tha-O H Bui

(57) ABSTRACT

Devices, systems, methods, and other embodiments associated with accessing memory using fractional reference voltage are described. In one embodiment, an apparatus includes comparison logic. The comparison logic compares a threshold voltage of a memory cell to at least one pair of reference voltages that are near an integral reference voltage to generate comparison results. The apparatus includes read logic to determine a bit value of the memory cell based, at least in part, on the comparison results.

20 Claims, 9 Drawing Sheets

ACCESSING MEMORY USING REFERENCE VOLTAGES

CROSS REFERENCE TO RELATED APPLICATIONS

This disclosure is a continuation of U.S. application Ser. No. 12/535,987 filed on Aug. 5, 2009, now U.S. Pat. No. 8,406,048, which claims benefit under 35 USC §119(e) to U.S. provisional application Ser. No. 61/087,417 filed on Aug. 8, 2008, which are both hereby wholly incorporated by reference.

BACKGROUND

Digital data is often stored and retrieved from memory. Memory can be manufactured in silicon. Semiconductor materials etched onto the silicon allow many transistors to be implemented in silicon to produce high density memories. The transistors may be configured to form logic gates, inverters, and other functions used to implement the memory.

To increase memory density, a single memory cell is now designed to contain two or more bits of data. For example, a floating gate transistor acting as a capacitor may be used to store a cell voltage that represents two bits of data. The cell voltage may be programmed by injecting electrons onto the transistor floating gate. Storing two or more bits in a memory cell increases the density of data that may be stored in the memory cell.

However, reading two or more bits of data is more difficult than reading one bit of data. For example, the memory cell may store the bit values of 00 when the cell voltage is a first level. The bit values represented in the memory cell may be 01, 10, and 11, respectively, when the cell voltage is a second, third, or fourth voltage level. To determine what bit values the cell voltage represents now requires four or more voltage comparisons because the cell voltage now represents one of four voltage levels. A better way to access memory is desired.

SUMMARY

An embodiment includes an apparatus. The apparatus includes comparison logic that compares a threshold voltage of a memory cell to at least one pair of reference voltages that are around an integral reference voltage and to generate comparison results, wherein the comparison logic is configured to compare the threshold voltage of the memory cell with the at least one pair of reference voltages when the threshold voltage is unreliable. Read logic determines a bit value of the memory cell based, at least in part, on the comparison results.

In one embodiment, the comparison logic generates the at least one pair of reference voltages that contains a first reference voltage and a second reference voltage. The bit value corresponds to one of: a first value or a second value. Threshold voltages in a first range of threshold voltages are associated with the first value. Threshold voltages in a second range of threshold voltages are associated with the second value. The first range of threshold voltages and the second range of threshold voltages are non-overlapping.

Another embodiment includes a method. The method compares a memory cell threshold voltage to a pair of reference voltages that are around an integral reference voltage to produce comparison results. The method determines a bit value represented in the memory cell based, at least in part, on the comparison results.

In one embodiment, the method generates a page of memory, where the bit value is associated with the page of memory. The method forwards the page of memory to a requesting logic that requested data from the page of memory.

Another embodiment includes an apparatus. The apparatus includes a voltage generator, access logic, and result generation logic. The voltage generator functions to generate a pair of reference voltages that are near an integral reference voltage. The access logic functions to determine a voltage value represented in a memory associated with a flash memory. The access logic functions to determine the voltage value by comparing a voltage level of the memory to the pair of reference voltages. The access logic further functions to generate a log-likelihood ratio (LLR) as a function of the voltage value. The result generation logic functions to produce a bit value based, at least in part, on the log-likelihood ratio.

In one embodiment, the boundaries between bit values of the memory cell correspond to integral reference voltages. The voltage values of the pair of reference voltages are different voltage values than the integral reference voltages.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
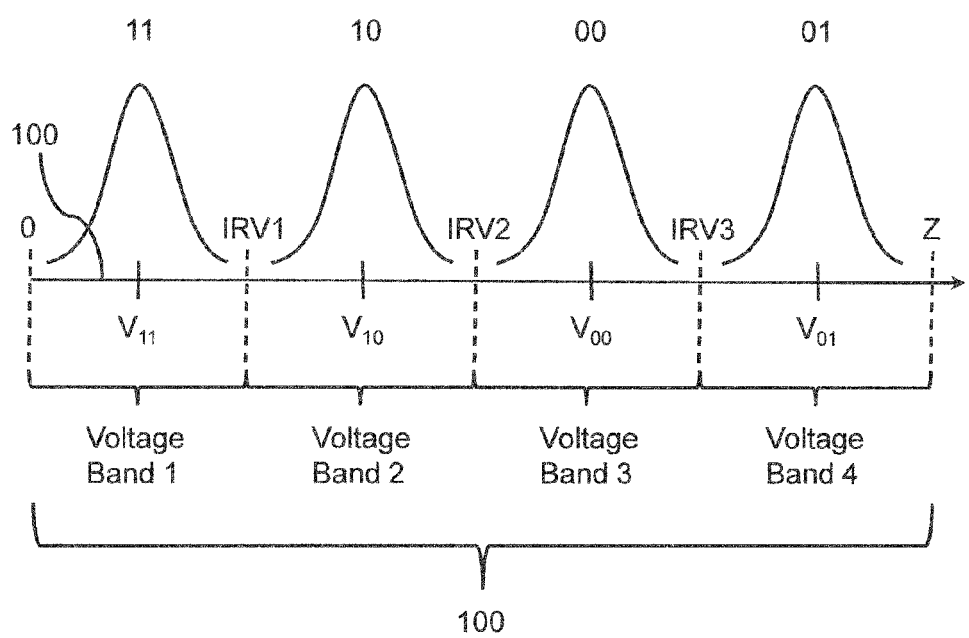
FIG. 1 illustrates one embodiment of integral reference voltages associated with a memory cell.

Described herein are example systems, methods, and other embodiments associated with accessing two or more bits in a memory cell. In one embodiment, an apparatus controls the access of a multi-level cell (MLC) of a flash memory. The MLC may contain a voltage that represents a most significant bit (MSB) and a least significant bit (LSB). The MSB and the LSB may be represented as a single cell threshold voltage level of a floating gate of a transistor.

The apparatus is configured to control the reading of the two bit values by causing the MLC cell to compare the cell voltage to fractional reference voltages. The bit values are determined without using integral reference voltages. Fractional reference voltages and integral reference voltages are defined below with reference to FIGS. 1 and 2. The MSB and the LSB are determined in series. The cell voltage is compared to an initial fractional reference voltage pair to first determine the MSB. After the MSB is determined, the cell voltage is compared to two or more secondary fractional reference voltage pairs to determine the LSB. In one embodiment, the secondary fractional reference voltage pairs are determined based on the value of the MSB as discussed later.

In one embodiment, an apparatus is implemented with an MLC, first bit detection logic, comparison logic, control logic, and second bit detection logic. The apparatus causes the first bit detection logic to determine a value of the first bit stored in the MLC. The first bit detection logic determines a value of the first bit by comparing a voltage level of the MLC that represents bit values to an initial pair of fractional reference voltage values. The comparison logic begins determining a second bit by comparing the voltage level of at least one secondary fractional reference voltage pair to the voltage level of the MLC to generate comparison results. The control logic controls the comparison logic so that the voltage level is compared after the first bit is known. The second bit detection logic determines the second bit based, at least in part, on the comparison results. It will be appreciated that when comparing a value(s) to a threshold, the apparatus can be implemented where the threshold is triggered or satisfied in a number of ways. For example, the compared value can be greater than or equal to the threshold, less than or equal, greater than, less than, or simply equal to the threshold. The implementation may depend on the values selected for the threshold and the type of comparison desired. Of course, other implementations can be used.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, flash memory, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software stored or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Memory access", as used herein, includes but is not limited to writing, reading, content addressable memory (CAM) matching, and programming a memory cell or a group of memory locations. Memory access may include dual reads to the same memory using two read ports. Memory access includes other types of interactions with memory as would be appreciated by those of ordinary skill in the art.

FIG. 1 illustrates one embodiment of integral reference voltages associated with a multi-level cell (MLC). The MLC may be associated with a flash memory. FIG. 1 shows a range of cell voltages 100 of the MLC extending from 0 to Z volts. Different voltage ranges on the range of cell voltages 100 represent different bit values. A cell voltage the MLC is charged to represents the value of an MSB and an LSB stored in the MLC. Electrons may be injected into the floating gate of a transistor to create the cell voltage.

The cell voltage is partitioned into non-overlapping voltage bands. The voltage bands are associated with one or more bit values. For example, for the MLC represented in FIG. 1, there are four voltage bands 1-4. The voltage bands 1-4 represent the range of cell voltages 100 associated with values of the MSB and LSB. Voltage band 1 represents bit values of "11", and voltage bands 2-4 represent bit values of "10", "00", and "01", respectively.

Ideally, the cell voltage would be set to a center voltage of one of the voltage bands 1-4 that correspond to bits that are stored in the MLC. For example, the cell voltage would be set to $V_{11}$ when the MLC value of "11" is stored in the MLC. The cell voltage would be set to $V_{10}$, $V_{00}$, and $V_{01}$, for corresponding values of "10", "00", and "01" stored in the MLC. Integral reference voltages IRV0-3 are the voltage values between the voltage bands 1-4. Even though FIG. 1 is shown for a two bit example, there may be other numbers of voltage bands 1-4, integral reference voltages IRV0-3, ranges of voltage voltages 100, ideal center voltages, bit values and so on.

Figure 2:
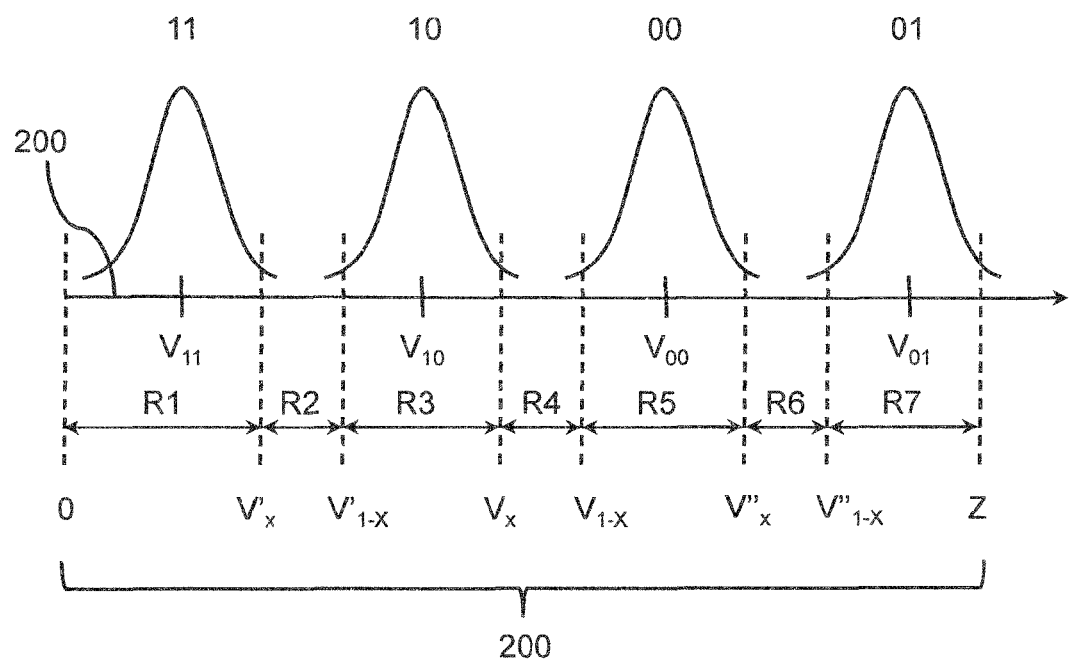
FIG. 2 illustrates one embodiment of fractional reference voltages associated with a memory cell.

FIG. 2 illustrates one embodiment of fractional reference voltages associated with the MLC of FIG. 1. FIG. 2 shows a similar range of cell voltages 200 as the range of cell voltages 100 of FIG. 1. The range of cell voltages 200 represents possible cell voltage values extending from 0 to Z volts. The cell voltage represents two bits, the LSB and the MSB. Those of ordinary skill in the art will appreciated that other MLCs may stored different numbers of bits and the cell voltage may represent different voltage ranges.

Fractional reference voltages are reference voltages in one of the voltage bands 0-3 shown in FIG. 1 (between two integral reference voltages IRV). For example, fractional reference voltage $V'_{1-x}$ of FIG. 2 is in voltage band 2 of FIG. 1 (e.g., near integral reference voltage IRV1; between IRV1 and IRV2). Fractional reference voltage $V''_x$ of FIG. 2 is in voltage band 3 of FIG. 1 (e.g., near integral reference voltage IRV 3). Fractional reference voltages $V'_x$ and $V'_{1-x}$ form a pair of fractional reference voltages that are near and/or around integral reference voltage IRV1 (e.g., or on both sides of the IRV1). Pairs of fractional reference voltages that are near and/or around an integral reference voltage are used to detect when a cell voltage is near a voltage band boundary. Fractional reference voltage pair, $V'_x$ and $V'_{1-x}$ may be used to detect when a cell voltage is near the boundary of voltage band 1 and voltage band 2. A value of the cell voltage may not be reliable when the cell voltage is near a voltage band boundary.

The cell voltage is determined to be near a boundary by comparing the cell voltage to the voltages represented by a fractional reference voltage pair. For example, a cell voltage determined to be between the fractional reference pair $V'_x$ and $V'_{1-x}$ is near a boundary between voltage bands 1 and 2. Cell voltages near voltage band boundaries may be unreliable because it may not be known with a high confidence level as to which side the cell voltage is on. The unreliable cell voltage may be flagged and transferred to a soft decoder to determine the actual bit values stored in the MLC based on the unreliable cell voltage. As discussed below, the unreliable cell voltage may be quantized and sent to a soft decoder to increase the odds that the correct bit values are determined. The soft decoder may contain error correction logic to determine the correct bit values associated with an unreliable cell voltage.

In one embodiment, the fractional reference voltage pair of $V_x$ and $V_{1-x}$ (shown in FIG. 2) is used to determine the MSB of the two bits represented in the MLC. One pair of fractional reference voltages is needed to compare the cell voltage in order to determine the MSB. Just one pair is needed because the bit values are gray coded with the MSB being "1" on the left half of the range of a cell voltages 200. The MSB is "0" on the right half of the range of cell voltages 200. The MSB is "1" when the cell voltage is to the left of $V_x$ and is "0" when the cell voltage is greater than $V_{1-x}$. The cell voltage is unreliable when the cell voltage is between $V_x$ and $V_{1-x}$.

Other fractional reference voltage pairs may be used to determine other bits. To determine the LSB, the cell voltage may need to be compared to more than one pair of fractional reference voltages. Fractional reference voltage pairs $V'_x$, $V'_{1-x}$ and $V''_x$, $V''_{1-x}$ may be used to determine the LSB of FIG. 2. If the cell voltage is less than $V'_x$ or greater than $V''_{1-x}$, then the LSB is "1". If the cell voltage is between $V'_{1-x}$ and $V''_x$, then the cell voltage is "0". If the cell voltage is between $V'_x$ and $V'_{1-x}$ or is between $V''_x$ and $V''_{1-x}$, then the cell voltage is unreliable and is handled as discussed above.

In contrast to an MLC that stores two bits, a one bit memory cell stores one bit. A one bit soft value corresponding to one bit stored in the one bit memory cell may be determined. The one bit soft value may be determined by comparing the fractional reference voltage to a cell voltage of the one bit memory cell. The soft values represent probabilities of values that the one bit corresponds to.

For example, the cell voltage, represented as $V_{th}$, of the one bit memory cell is compared with the initial reference voltage pair $V_x$, $V_{1-x}$ of FIG. 2, to determine the one bit soft value. The one bit soft value is determined to be 0 when $V_{th}$ is less than $V_x$. The one bit soft value is determined to be $(V_x+V_{1-x})/2$ when $V_{th}$ between $V_x$ and $V_{1-x}$. The one bit soft value is determined to be a value Z when $V_{th}$ is greater than $V_{1-x}$. The soft value may be input to a soft decoder to generate a value representing the bit stored in the memory as discussed below.

A log-likelihood ratio (LLR) may be generated as a function of the cell voltage of the one bit memory cell. The LLR may be a probability that a certain value has been stored in the memory as a first value. For example, the LLR of the one bit memory cell may be represented as:

$$LLR=0.5\ Log(S_2/S_1)+(m_2-m_1)^2/S_2,$$

when the memory cell reference voltage is less than $V_x$. Variance values of the voltage distributions are represented as $S_1$ and $S_2$. The values $m_1$ and $m_2$ represent Gaussian distribution mean values. The LLR of the one bit memory cell may be represented as:

$$LLR=0.5\ Log(S_2/S_1)+(v-m_1)^2/S_2-(v-m_2)^2/S_2,$$

when the memory cell reference voltage is between $V_x$ and $V_{1-x}$. The LLR of the one bit memory cell may be represented as:

$$LLR=0.5\ Log(S_2/S_1)-(m_2-m_1)^2/S_1,$$

when the memory cell reference voltage is greater than $V_{1-x}$. The LLR may be input to a soft decoder to generate a value representing the bit stored in the memory as discussed below.

In one embodiment, both $v'_x$ and $v''_{1-x}$ are used to determine the LSB of a MLC. This is because all the cells in a MLC that is part of a wordline (corresponding to a MSB or LSB page) can apply a single reference voltage (e.g., $v'_x$) at a time. After a first comparison is completed, a next reference voltage (e.g., $v''_{1-x}$) can be applied. The LSB may be determined based on the comparison results. The fractional reference voltage used to determine the LSB may be compared without comparing the fraction reference used to determine the MSB. This is because the MLCs of NAND devices support "random" reads. Random reads allow a host to request the LSB page without requesting the MSB page. The MSB remains unknown when the LSB page is read without requesting the MSB.

Returning to the two bit MLC example, the three pairs of fractional reference voltages $V'_x/V'_{1-x}$, $V_x/V_{1-x}$, and $V''_x/V''_{1-x}$ partition the line of cell voltage up into seven regions R1-7 as shown in FIG. 2. In general, conditional comparisons such as determining the MSB first and then determining the LSB based on the value of the MSB are not allowed in MLCs that are NAND devices. However, it is interesting to notice that fractional reference voltage pair $V'_x$, $V'_{1-x}$ is sufficient to determine the LSB when the MSB is "1" because when the MSB is "1", the LSB will be in region 1, 2, or 3. Comparing the cell voltage to fractional reference voltage pair $V'_x$, $V'_{1-x}$ is sufficient to determine the LSB because the LSB cannot be in regions R5-7 when the MSB is "1". Fractional reference voltage pair $V''_x$, $V''_{1-x}$ is sufficient to determine the LSB when the MSB is "0". Pair $V''_x$, $V''_{1-x}$ is sufficient because when the MSB is "0", the LSB will be in region 5, 6, or 7. The LSB cannot be in regions R1-3 when the MSB is "0".

Figure 3:
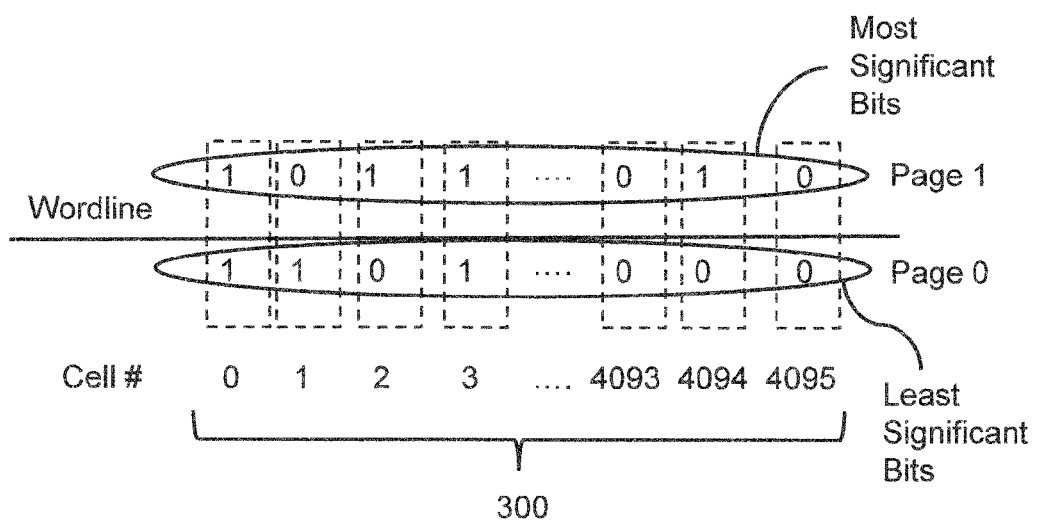
FIG. 3 illustrates one embodiment of a memory map associated with accessing memory.

FIG. 3 illustrates one embodiment of a memory map 300 associated with accessing memory. The memory map 300 may illustrate a memory map for a flash memory that is implemented with MLCs. FIG. 3 shows an array of 4096 MLCs that store values that represent MSBs and LSBs. The 4096 cells are referred to as a wordline. Groups of LSBs of different MLCs are combined to form a first page (page 0) of memory. The MSBs are combined to form a second page (page 1) of memory. Pages of memory represent groups of cells (cell numbers 0 to 4095) that are accessed together. Ideally, a group of cells are architected and arrayed in silicon so that the group is accessed in a single clock cycle. The 4096 bits of the first page (page 0) are accessed in parallel in one clock cycle.

Determining a value of the LSB may take longer than determining a value of the MSB. For example, voltage comparisons are made between a cell voltage of an MLC and pairs of fractional reference voltages when determining the value of an LSB or an MSB, as discussed with reference to FIG. 2. In some instances, LSB pages may require a comparison of two pairs of fractional voltages. The additional LSB comparisons cause the access time of the LSB to be longer than the MSB access time. Therefore, the access time associated with the LSB wordline of "page 0" in of FIG. 1 will be longer than the access time of "page 1".

Figure 4:
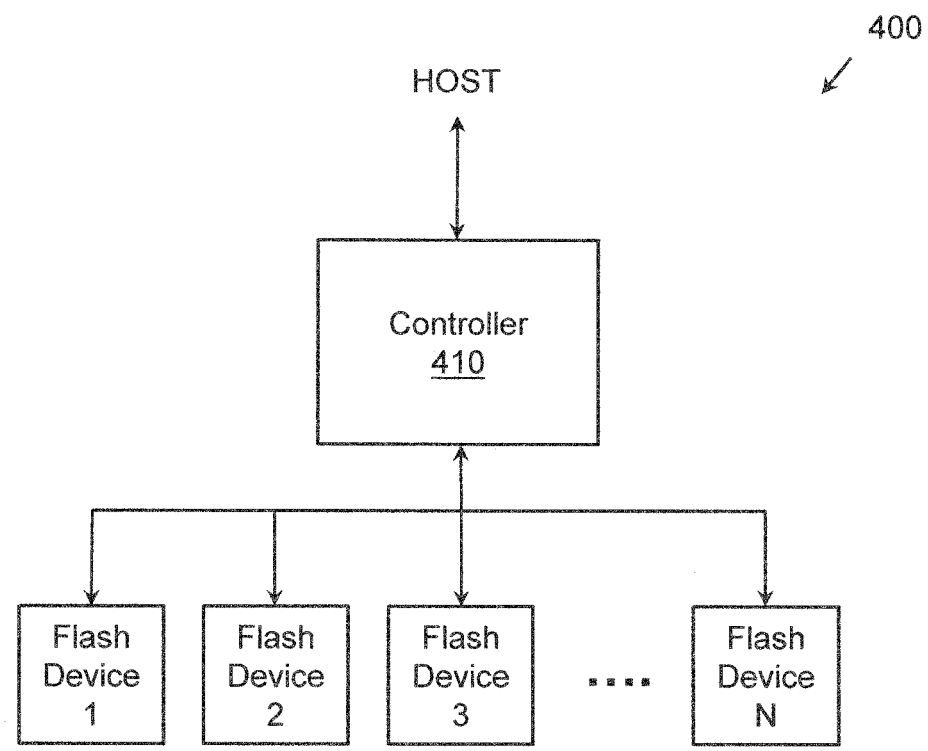
FIG. 4 illustrates an embodiment of a memory system associated with accessing memory.

FIG. 4 illustrates one embodiment of a system 400 associated with accessing two or more bits in a memory cell. The system 400 comprises a controller 410 that controls the accessing of memory by scheduling page requests to flash devices 1-N. The flash devices 1-N are implemented with MLCs that represent more than one bit of data. The controller 410 instructs the flash devices 1-N to determine cell voltages representing bit values by comparing the cell voltage with pairs of fractional reference voltages. The controller 410 more efficiently controls the flash devices 1-N by controlling the flash devices 1-N to make cell voltage comparisons to fractional reference voltages. The controller 410 prevents the flash devices 1-N from comparing cell voltages to integral reference voltages. Details and embodiments of the controller 410 will be discussed with reference to FIG. 5, apparatus 500, and the other figures as explained herein.

Figure 5:
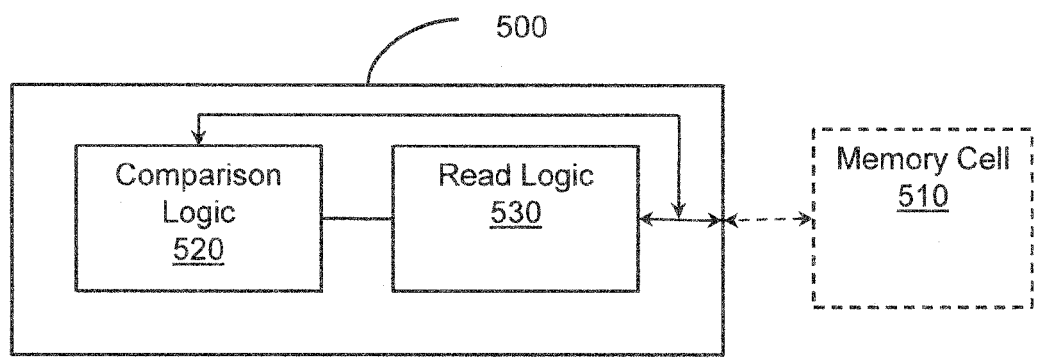
FIG. 5 illustrates an embodiment of an apparatus associated with accessing two or more bits in a memory cell.

FIG. 5 illustrates one embodiment of an apparatus 500 associated with determining bit values of a memory cell 510. The apparatus 500 controls the memory cell 510 so that the memory cell 510 uses fractional reference voltages to access data in the memory cell 510. The apparatus 500 may be implemented to access pages of flash memory in flash memory chips implemented with arrays of the memory cell 510. The memory cell 510 may be an MLC storage cell. The storage cell may be a NAND MLC. In one embodiment, the apparatus 500 is implemented as a memory controller in a chip. A chip may be a set of micro-miniaturized electronic circuits fabricated on semiconductor material.

In one embodiment, the apparatus 500 is implemented with a comparison logic 520 and a read logic 530. The comparison logic 510 determines a bit value of in the memory cell 510. The bit value may determined by comparing a cell voltage to a pair of fractional reference voltages as describe above with reference to FIG. 2 to produce comparison results. The read logic 530 determines the bit value based on the comparison results.

The bit value may represent a first bit that is an MSB of two bits stored in the memory cell 510. The first bit and a second bit are stored in the MLC according to a binary gray code. The second bit is an LSB. A gray code orders binary values so that one bit changes value between adjacent binary values.

To determine the LSB, the comparison logic 520 is configured to compare the cell voltage of the MLC with other fractional reference voltage pairs to generate comparison results. The comparison results may be expressed as a log-likelihood ratio (LLR). An LLR is a probability that a certain cell value has been stored in the memory cell 510. As discussed below, a decoder will determine the actual cell value based on the LLR, values in adjacent bits, and error correction algorithms.

In one embodiment, to facilitate the determining of the second bit, the comparison logic 520 is configured to generate another fractional reference voltage pair that contains a first reference voltage and a second reference voltage. The first and second reference voltages are different voltage values in different MLC threshold voltage ranges that are non-overlapping. Non-overlapping MLC threshold voltage ranges correspond to different second bit values. The first reference voltage and the second reference voltage form a fractional reference voltage pair because the first and second reference voltages are different voltage values in different MLC threshold voltage ranges and, therefore, conform to the definition of a fractional reference voltage pair as described above with reference to FIG. 2.

The comparison logic 520 is configured to compare the voltage level of the memory cell 510 with the first reference voltage by applying the first reference voltage to the gate of a transistor in the MLC storing the second bit. The read logic 530 is configured to determine whether current flows in the transistor. The read logic 530 determines the voltage level is less than the first reference voltage when a drain to source current flows in the transistor. The memory cell 510 would have been programmed earlier by injecting electrons into the transistor gate where the cell voltage is stored.

The read logic 530 determines a value of the second bit as a function of the comparison results. A value of the second bit is determined by comparing whether the cell voltage is greater or less than the fractional reference voltage pairs as discussed with reference to FIG. 2. The first bit and the second bit may be read in any order and the second bit may be read without reading the first bit and vice-versa.

In one embodiment, the comparison logic 520 uses two pairs of fractional reference voltages to determine the second bit value. The fractional reference voltage pairs are compared to the cell voltage as discussed above with reference to FIG. 2. In another example, the comparison logic 520 uses one pair of fractional reference voltages to determine a second bit value of a memory cell 510 that stores two bits.

In one implementation, the first bit and the second bit correspond to MLC threshold voltage values, where different MLC threshold voltage values correspond to different non-overlapping MLC threshold voltage ranges. The threshold voltage ranges correspond to the voltage bands 1-4 of FIG. 1. For example, the MSB is "1" when the threshold voltage range is in voltage band 1 or voltage band 2 of FIG. 1.

The fractional reference voltage pairs contain a first reference voltage and a second reference voltage that are in different voltage regions R1-7 as shown in FIG. 2. The different voltage ranges are non-overlapping. Other embodiments may have other numbers of voltage ranges and other numbers of fractional reference voltage pairs.

In one configuration, the boundaries between the MLC threshold voltage ranges correspond to integral reference voltages. The first reference voltage is different than voltage values of the integral reference voltages. The second reference voltage is different than the voltage values of the integral reference voltages.

In one embodiment, the comparison logic 520 may provide voltage comparison results that represent soft bit values to a soft decoder. A soft bit value is a probability that the soft bit value corresponds to a specific bit value. The soft decoder will compare soft values of related bits and may analyze soft bit values of other adjacent 510 memory cells. The soft decoder will determine the actual first bit value and the actual second bit value based on the analysis and comparison of related soft values. The soft decoder may use error correction logic to correct bit values when the bit values contain an error. For example, the soft decoder may be a low density parity check (LDPC) decoder or a turbo decoder and may correct bit errors using parity check bits associate with the first bit and second bit.

In one example, the comparison logic 520 will determine the soft value of the first bit (e.g., MSB of a two bit memory cell) by comparing the cell voltage, $V_{th}$, of the memory cell 510 with a reference voltage pair $V_x$, $V_{1-x}$. The reference voltage pair is shown in FIG. 2. The results of the possible comparisons are shown below in Table 1. Output Y of Table 1 is the corresponding soft value for the three valid comparison results. One comparison result is not possible because $V_{th}$ cannot be less than $V_x$ and greater than $V_{1-x}$ at the same time.

TABLE 1

| Comparison with $V_x$ | $V_{th} < V_x$ | $V_{th} < V_x$ | $V_{th} >= V_x$ | $V_{th} >= V_x$ |
|---|---|---|---|---|
| Comparison with $V_{1-x}$ | $V_{th} < V_{1-x}$ | $V_{th} >= V_{1-x}$ | $V_{th} < V_{1-x}$ | $V_{th} >= V_{1-x}$ |
| Output Y | $(V_{11} + V_{10})/2$ | Not Possible | $(V_x + V_{1-x})/2$ | $(V_{00} + V_{01})/2$ |

Output Y is the soft value of the threshold voltage. The values of $V_{00}$, $V_{01}$, $V_{10}$, and $V_{11}$ may be the voltages that represent the ideal binary bit values of 00, 01, 10, and 11 shown in FIG. 2. The soft value is $(V_x + V_{1-x})/2$ when the threshold voltage is between the pair of threshold reference voltages. A threshold voltage between the pair of threshold reference voltages may indicate a soft value with a low confidence level. The soft decoder will look more carefully at related adjacent soft bit values when the confidence level is low. The soft decoder may give soft bit values adjacent to a soft bit value with a low confidence level more weight.

The comparison logic 520 is configured to make similar comparisons between secondary fractional reference voltages and the threshold voltage to determine soft bit values associated with the second bit (e.g., LSB of a two bit memory cell). The read logic 530 determines the second bit values that may be soft values based, at least in part, on comparison results of the secondary fractional reference voltages. The comparison results and the second bit values determined from the comparison results are shown below in Table 2.

TABLE 2

| Comparison Outcome | $V_{th} < V'_x$ | $V_{th} >= V'_x$ | $V_{th} >= V'_x$ | $V_{th} >= V'_x$ | $V_{th} >= V'_x$ |
|---|---|---|---|---|---|
| | $V_{th} < V'_{1-x}$ | $V_{th} < V'_{1-x}$ | $V_{th} >= V'_{1-x}$ | $V_{th} >= V'_{1-x}$ | $V_{th} >= V'_{1-x}$ |
| | $V_{th} < V''_x$ | $V_{th} < V''_x$ | $V_{th} < V''_x$ | $V_{th} >= V''_x$ | $V_{th} >= V''_x$ |
| | $V_{th} < V'''_{1-x}$ | $V_{th} < V'''_{1-x}$ | $V_{th} < V'''_{1-x}$ | $V_{th} < V'''_{1-x}$ | $V_{th} >= V'''_{1-x}$ |
| Output Y | $V_{11}$ | $(V'_x + V'_{1-x})/2$ | $(V_{10} + V_{00})/2$ | $(V''_x + V''_{1-x})/2$ | $V_{01}$ |

Figure 6:
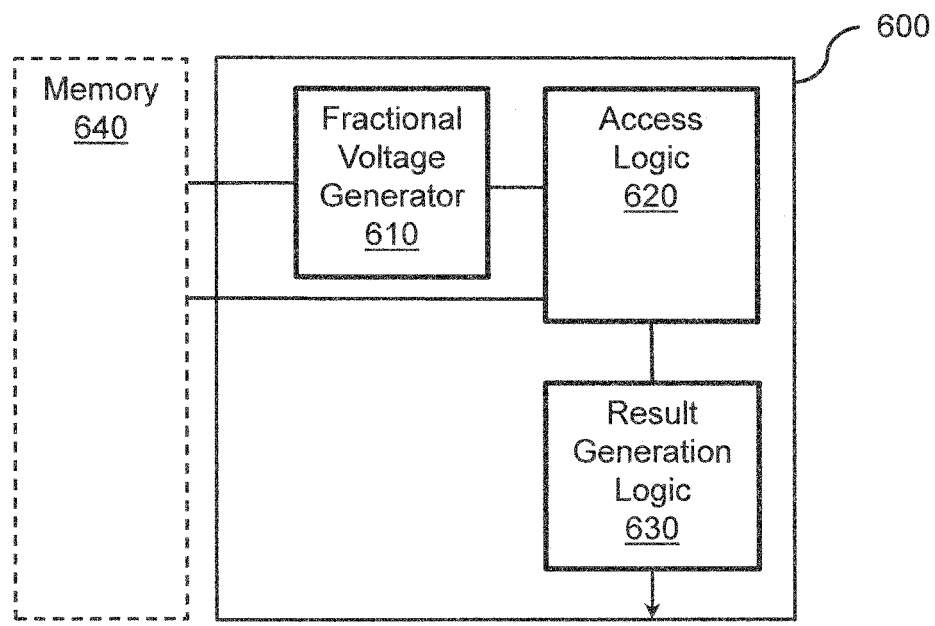
FIG. 6 illustrates another embodiment of an apparatus associated with accessing two or more bits in a memory cell.

FIG. 6 illustrates one embodiment of an apparatus 600 associated with accessing bits of data in a memory cell. The apparatus 600 determines a bit value of a memory cell using fractional reference voltages without using integral reference voltages. The memory cell may be a multi-level cell (MLC) that stores two or more bit values. The apparatus 600 can determine one bit value of the MLC using fractional reference voltages without determining the other bit values of the MLC. Fractional reference voltages and integral reference voltages are described above with reference to FIGS. 1 and 2. The apparatus 600 may be implemented to access MLCs implemented in a flash memory. The apparatus 600 may be implemented in a controller that controls flash memory.

In one embodiment, the apparatus 600 is implemented with a fractional voltage generator 610, an access logic 620, and result generation logic 630. The apparatus 600 may receive memory access instructions. A memory access instruction may request access to a first page and a second page of flash memory. In one embodiment, instruction decode logic is configured to decode the received memory access instructions. The instruction may be decoded by an instruction decode logic implemented with combinational logic.

The fractional voltage generator 610 generates a fractional reference voltage pair. The fractional reference voltage pair is generated so that the access logic 620 can determine a voltage value represented in a memory 640. The voltage value may represent a bit value of a first page of flash memory and the memory 640 may be a flash memory cell. The access logic 620 determines the voltage value by comparing a voltage level of the memory 640 to the fractional reference voltage pair to produce comparison results.

For example, the fractional reference voltage pair may be the fractional reference voltage pair $V_x$, $V_{x-1}$ shown in FIG. 2. The result generation logic 630 sets the voltage value to the output Y value of Table 1 based on the comparison results. For example, the result generation logic 630 sets the voltage value to an approximate value of $(V_x + V_{x-1})/2$ when the memory cell 640 voltage level is between $V_x$ and $V_{x-1}$. The approximate value may later indicate to a decoder that the approximate value is a low confident value and that error correction may need to be performed to determine a first value with higher confidence.

In one embodiment, the bit value may represent a MSB of a MLC. The result generation logic 630 is configured to generate a log-likelihood ratio (LLR) for the MSB as a function of the comparison results. The LLR may be a probability that of a certain value has been stored on the memory cell 640 as a voltage value. For example, the LLR of the MSB may be represented as:

$$LLR_{MSB} = \frac{\log\left(\frac{1}{\sqrt{2\pi}\,\sigma_{11}}e^{-\frac{(y-v_{11})^2}{2\sigma_{11}^2}} + \frac{1}{\sqrt{2\pi}\,\sigma_{10}}e^{-\frac{(y-v_{10})^2}{2\sigma_{10}^2}}\right)}{\log\left(\frac{1}{\sqrt{2\pi}\,\sigma_{10}}e^{-\frac{(y-v_{00})^2}{2\sigma_{00}^2}} + \frac{1}{\sqrt{2\pi}\,\sigma_{00}}e^{-\frac{(y-v_{01})^2}{2\sigma_{01}^2}}\right)}.$$

An LLR of a second bit (LSB) of a two bit MLC may be represented as:

$$LLR_{LSB} = \frac{\log\left(\frac{1}{\sqrt{2\pi}\,\sigma_{11}}e^{-\frac{(y-v_{11})^2}{2\sigma_{11}^2}} + \frac{1}{\sqrt{2\pi}\,\sigma_{01}}e^{-\frac{(y-v_{01})^2}{2\sigma_{01}^2}}\right)}{\log\left(\frac{1}{\sqrt{2\pi}\,\sigma_{10}}e^{-\frac{(y-v_{10})^2}{2\sigma_{10}^2}} + \frac{1}{\sqrt{2\pi}\,\sigma_{00}}e^{-\frac{(y-v_{01})^2}{2\sigma_{01}^2}}\right)}.$$

The variable y is the read out cell voltage. The variables $v_{11}$, $v_{10}$, $v_{01}$, and $v_{10}$ are the voltages $V_{11}$, $V_{10}$, $V_{00}$, and $V_{10}$, respectively, shown on the range of cell voltages 100, 200 in FIGS. 1 and 2. The variable $\sigma_{11}$, $\sigma_{10}$, $\sigma_{01}$, and $\sigma_{00}$, are standard deviations of the distribution functions for the voltages $V_{11}$, $V_{10}$, $V_{00}$, and $V_{10}$, respectively.

The result generation logic 630 quantizes the MSB. Quantization is the process of approximating a continuous range of values such as the voltage level of the memory cell 640 to a set of discrete symbols or values. In digital signal processing, a multi-dimensional signal is quantized by approximating continuous ranges of values to discrete symbols or integer values. In contrast, discrete signals do not need to be quantized.

In one embodiment, the access logic 610 reads the voltage level of the memory cell 640. The result generation logic 630 quantizes the voltage level to a quantized value to produce a quantized value. Then the result generation logic 630 generates a log-likelihood ratio (LLR) as a function of the quantized value. The result generation logic 630 is implemented with a decoder to translate the LLR value to specified bits.

In another embodiment, the result generation logic 630 may quantize the bit value to a non-binary number. The apparatus 600 may be implemented with bit decode logic to decode a bit values that is a non-binary quantized values into a binary value.

For example, a sampler may take an analog sample of a voltage of the memory 640. The bit decode logic may quantize the analog voltage sample into a binary value. The bit decode logic may be a low density parity check (LDPC) decoder or a turbo decoder that decodes more than one bit at a time. For example, eight bits of data from eight different memories 640 may be decoded together. The LDPC decoder may use an LDPC algorithm to correct for a bit error in the eight bits of data. The bit decode logic may correct for errors with other error correction methods and may use parity bits to correct for errors.

In one embodiment, control logic is configured to control the result generation logic 630 to determine a page of data values of a memory page. The bit value represents one bit of the page of data values. The page may be a string of bits read from banks of flash memory cells. The string of bits may correspond to a string of bits associated with a wordline line. For example a first page may comprise 4096 (4K) bits of data. The bit value represents one of the 4096 bits in the first page. The other 4096 bits are determined in parallel similar to how the apparatus 600 determined the bit value.

In one embodiment, the apparatus 600 may determine the second bit independently of the other bit value in a MLC by the fractional voltage generator 610 generating different fractional reference voltage pairs. The access logic 620 will compare the different fractional reference voltage pairs to the threshold voltage of the memory cell 640. In one example, the second pair of fractional reference voltage may correspond to the fractional reference voltage pairs $V'_x, V'_{x-1}$, and $V''_x, V''_{x-1}$ of FIG. 2. A second value corresponding to a second page is read from the memory cell 640 by comparing the voltage level of the memory cell 640 to the different fractional reference voltage pairs. The result generation logic 630 may be configured to quantize second value to produce a second quantized bit value. The result generation logic 630 may create a second LLR value based on the second quantized bit value. The second LLR value may be converted to an actual bit value by a soft decoder as described above.

Figure 7:
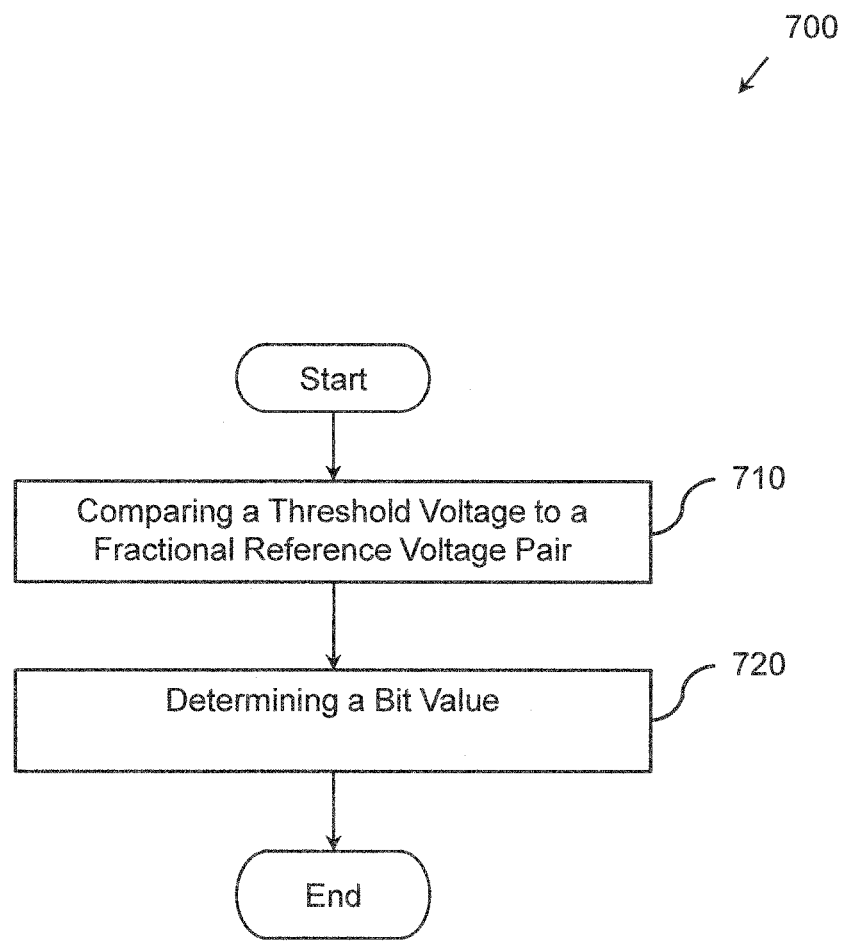
FIG. 7 illustrates one embodiment of a method associated with accessing two or more bits in a memory cell.

FIG. 7 illustrates an embodiment of a method 700 associated with accessing bits of data in a memory cell. The method 700 improves the reading of memory cells with multiple bits by comparing fractional reference voltages and determining bit values without comparing integral reference voltages. The memory cells may be multi-level cells (MLCs). Fractional reference voltage pairs are discussed above with reference to FIGS. 2, 5, and 6. The method 700 may be implemented in a flash memory chip. The method may be implemented in a hardware (e.g., a chip), software, or a combination of hardware and software.

The method 700 compares, at 710, a memory cell threshold voltage to a pair of fractional reference voltages to produce comparison results. The memory cell stores one or more bit values as the memory cell threshold voltage. The comparison may be made using a comparator. The comparator compares the voltage level with the first reference voltage by applying the fractional reference voltage to the gate of a transistor in the memory cell. The voltage level is less than a fractional reference voltage when a drain to source current flows in the transistor. Other fractional reference voltages may be applied to the memory cell to generate other comparison results.

A determination is made, at 720, to generating a bit value represented in the memory cell. The determination, at 720, is based, at least in part, on the comparison results without using integral reference voltages. The bit value may be determined by first generating a quantized bit value according Table 1 and Table 2 as discussed above. As discussed below, the quantized bit value may be converted a log-likelihood ratio (LLR) and sent to a soft decoder. The soft decoder will determine a bit value represented by the memory cell threshold voltage based, at least in part, on the quantization value.

Figure 8:
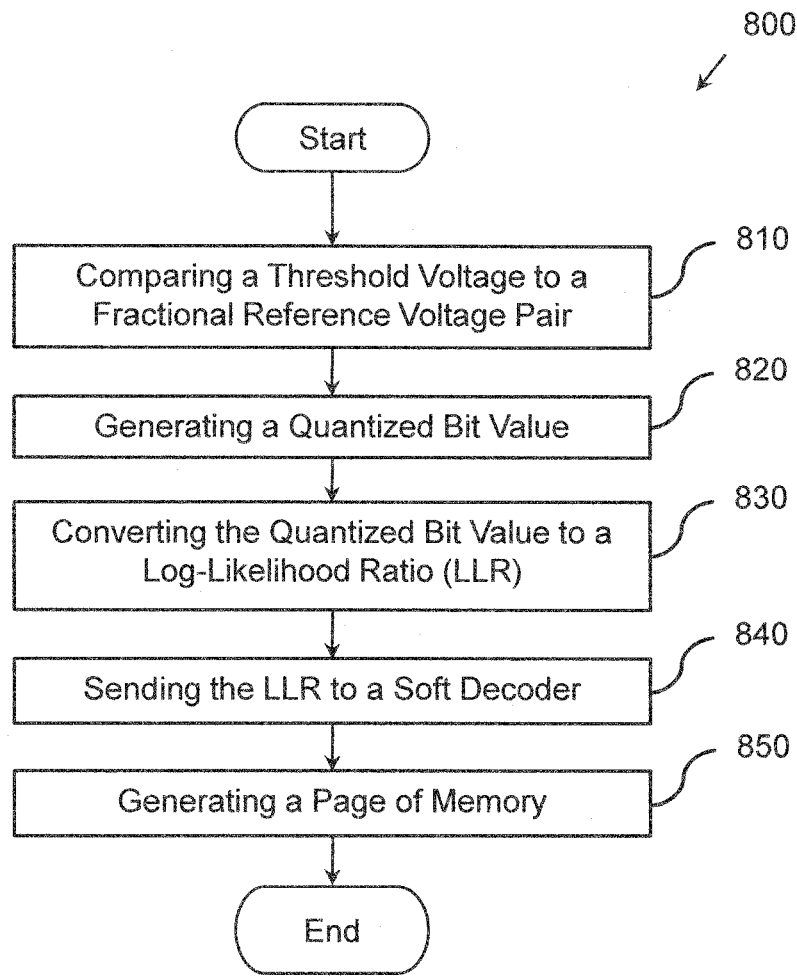
FIG. 8 illustrates another embodiment of a method associated with accessing two or more bits in a memory cell.

FIG. 8 illustrates an embodiment of a method 800 associated with accessing bits of data in a memory cell. The method 800 improves the reading of memory cells storing bits by comparing fractional reference voltages and determining bit values without comparing integral reference voltages. The method 800 may be implemented, using hardware (e.g., a chip), executable instructions stored in a memory, or a combination of hardware and instructions.

The method 800 compares, at 810 a memory cell threshold voltage to a pair of fractional reference voltages to produce comparison results. A quantized value of the bit value is generated at 820. In one embodiment, the bit value is quantized to one of three values: $(V_{11}+V_{10})/2$, $(V_x+V_{1-x})/2$, and $(V_{00}+V_{01})/2$. The values $V_x$ and $V_{1-x}$ are voltage values of the pair of fractional reference voltages. The cell voltage may be quantized according to Table 1 discussed above. The bit value may be quantized according to Table 2 discussed above when the memory cell is a two bit multi-level cell (MLC). The bit value may be quantized in other ways as understood by those of ordinary skill in the art.

The quantized bit value can be converted, at 830, to a log-likelihood. The LLR corresponds to the memory cell threshold voltage and is associated with the bit value. The LLR may be a probability that of a certain value has been stored on the memory cell as a first value. For a memory cell that stores two bits of data in one cell, one memory voltage will represent an MSB and an LSB. The LLR of the LSB and the MSB are calculated according to:

$$LLR_{LSB} = \frac{\log\left(\frac{1}{\sqrt{2\pi}\,\sigma_{11}}e^{-\frac{(y-v_{11})^2}{2\sigma_{11}^2}} + \frac{1}{\sqrt{2\pi}\,\sigma_{01}}e^{-\frac{(y-v_{01})^2}{2\sigma_{01}^2}}\right)}{\log\left(\frac{1}{\sqrt{2\pi}\,\sigma_{10}}e^{-\frac{(y-v_{10})^2}{2\sigma_{10}^2}} + \frac{1}{\sqrt{2\pi}\,\sigma_{00}}e^{-\frac{(y-v_{00})^2}{2\sigma_{00}^2}}\right)} \text{ and}$$

$$LLR_{MSB} = \frac{\log\left(\frac{1}{\sqrt{2\pi}\,\sigma_{11}}e^{-\frac{(y-v_{11})^2}{2\sigma_{11}^2}} + \frac{1}{\sqrt{2\pi}\,\sigma_{10}}e^{-\frac{(y-v_{10})^2}{2\sigma_{10}^2}}\right)}{\log\left(\frac{1}{\sqrt{2\pi}\,\sigma_{10}}e^{-\frac{(y-v_{00})^2}{2\sigma_{00}^2}} + \frac{1}{\sqrt{2\pi}\,\sigma_{00}}e^{-\frac{(y-v_{01})^2}{2\sigma_{01}^2}}\right)}.$$

The values of $LLR_{MSB}$ and $LLR_{LSB}$ are the LLR values of the first bit value and the second bit value, respectively. The variable y is the cell voltage. The variables $v_{11}$, $v_{10}$, $v_{01}$, and $v_{10}$ are the center voltages $V_{11}$, $V_{10}$, $V_{00}$, and $V_{10}$, respectively, as shown on the range of cell voltages 100, 200 in FIGS. 1 and 2. The variables $\sigma_{11}$, $\sigma_{10}$, $\sigma_{01}$, and $\sigma_{00}$, are distribution functions for the voltages $V_{11}$, $V_{10}$, $V_{00}$, and $V_{10}$, respectively.

The method 800 sends, at 840, LLR to a soft decoder. The soft decoder determines an actual first bit value as a function of the LLR. The soft decoder may be a low density parity check (LDPC) decoder or a turbo decoder that determines the first bit value based, at least in part, on the LLR. As discussed above, the soft decoder will determine an actual first bit value based, at least in part, on the LLR, other MLCs bit values, and error correction algorithms.

In another embodiment, a page of memory is generated at 850. The bit value represents one of the bits of the page of memory. A page of memory may be 4096 bits of data and may correspond to a bitline of data in a flash memory array. Other bits of the page of memory may be associated to other bit values of other MLCs. The other bit values may be determined similar to the bit value. The page of memory may be other sizes with a different number of bits than 4096 bits. The size of the page of memory will depend on the architecture of memory cell arrays as well as other standards.

It will be appreciated that in one embodiment, the methods herein may be implemented as computer executable instructions embodied and stored on a computer-readable medium. When executed by a machine (e.g., processor, device) the instructions cause the machine to perform the methods herein and their equivalents. The methods can also be implemented with circuits.

Figure 9:
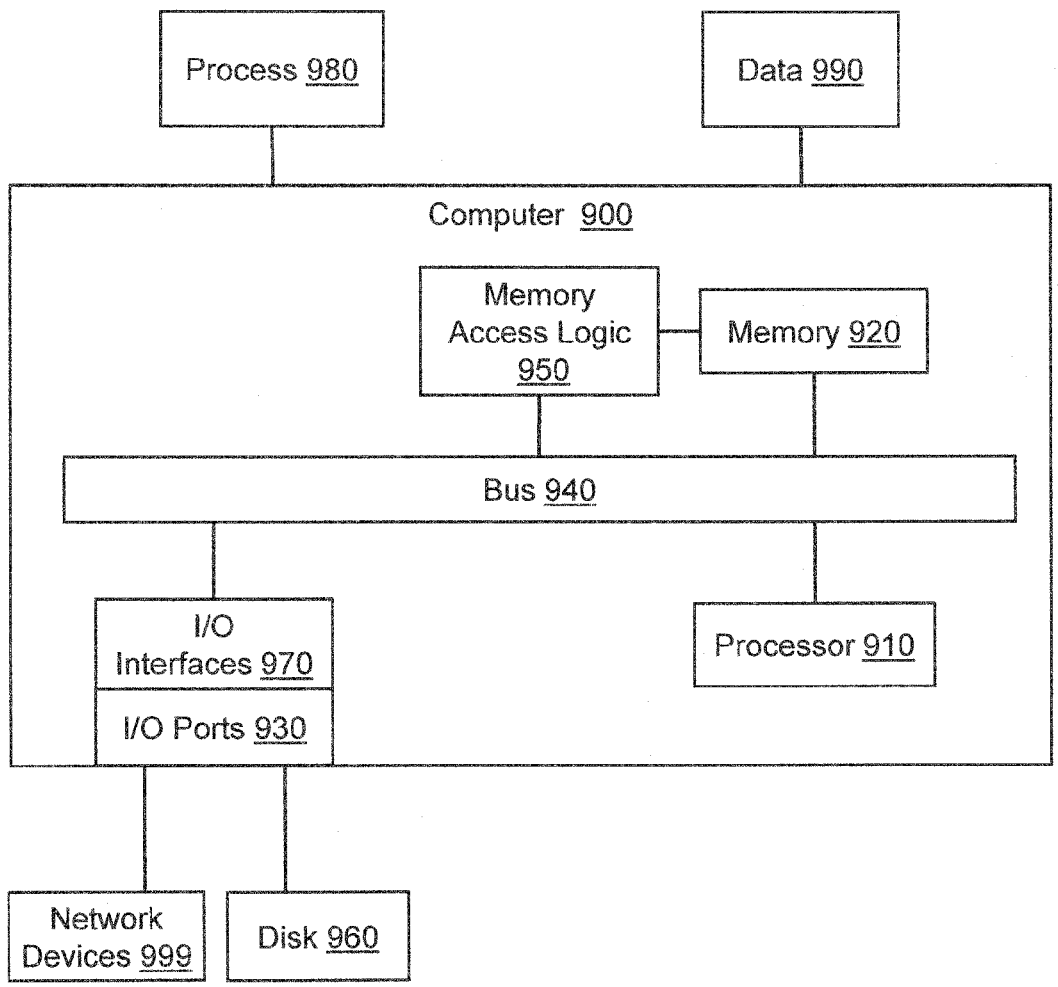
FIG. 9 illustrates an embodiment of a computing environment in which example systems and methods, and equivalents associated with accessing two or more bits in a memory cell may operate.

FIG. 9 illustrates an example computer 900 in which example systems and methods described herein, and equivalents, are implemented. The example computer 900 comprises a processor 910, a memory 920, and input/output ports 930 operably connected by a bus 940. In one example, the computer 900 comprises memory access logic 950 to access one or more bits in a memory cell. The memory access logic 950 is configured to determine one or more bits in a memory cell by comparing a memory cell voltage to fractional reference voltages. The memory access logic 950 is configured to access one bit in the memory cell independent of other bits that may be stored in the memory cell.

The memory access logic 950 provides means (e.g., hardware, stored software, and firmware) to selectively access data in a memory cell of a flash memory, a solid state memory, memory 920, or another memory. The memory access logic 950 can be implemented similar to the apparatus 500 and 600, and/or combinations of their features. The memory access logic 950 can include logic implemented, for example, as an ASIC or other type of circuit.

Generally describing an example configuration of the computer 900, the processor 910 may be a variety of various processors including dual microprocessor and other multiprocessor architectures. A memory 920 may include volatile memory and/or non-volatile memory. Non-volatile memory may include, for example, read-only memory (ROM), programmable read only memory (PROM), erasable programmable read only memory (EPROM), electronically erasable programmable read only memory (EEPROM), and so on. Volatile memory may include, for example, random access memory (RAM), static random access memory (SRAM), dynamic random access memory (DRAM), and so on.

A disk 960 may be operably connected to the computer 900 via, for example, through an input/output interface (e.g., card, device) 970 and the input/output port 930. The disk 960 may be, for example, a magnetic disk drive, a solid state disk drive, a floppy disk drive, a tape drive, a Zip drive, a flash memory card, a memory stick, and so on. Furthermore, the disk 960 may be a compact disk read-only memory (CD-ROM) drive, a compact disk recordable (CD-R) drive, a compact disk rewritable (CD-RW) drive, a digital video disk read-only memory (DVD ROM), and so on. The memory 920 can store a process 980 and/or a data 990, for example. The disk 960 and/or the memory 920 can store an operating system that controls and allocates resources of the computer 900.

The bus 940 may be a single internal bus interconnect architecture and/or other bus or mesh architectures. While a single bus is illustrated, it is appreciated that the computer 900 may communicate with various devices, logics, and peripherals using other busses (e.g., peripheral component interconnect express (PCIE), 1394, universal serial bus (USB), Ethernet). The bus 940 can be types including, for example, a memory bus, a memory controller, a peripheral bus, an external bus, a crossbar switch, and/or a local bus.

The computer 900 may interact with input/output devices via the input/output (I/O) interfaces 970 including the memory access logic 950 and the input/output ports 930. Input/output devices may be, for example, a keyboard, a microphone, a pointing and selection device, cameras, video cards, displays, the disk 960, the network devices 999, and so on. The input/output ports 930 may include, for example, serial ports, parallel ports, and USB ports.

The computer 900 can operate in a network environment and thus may be connected to the network devices 999 via the I/O interfaces 970, and/or the I/O ports 930. Through the network devices 999, the computer 900 may interact with a network. Through the network, the computer 900 may be logically connected to remote computers. Networks with which the computer 900 may interact include, but are not limited to, a local area network (LAN), a wide local area network (WLAN), a wide area network (WAN), and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
comparison logic configured to compare a threshold voltage of a memory cell to one pair of reference voltages that define a band around an integral reference voltage and to generate comparison results by comparing the threshold voltage of the memory cell with the one pair of reference voltages without comparing the threshold voltage to the integral reference voltage, wherein the comparison logic is configured to compare the threshold voltage only to the one pair of reference voltages when the threshold voltage is within the band; and
read logic to determine a bit value of the memory cell based, at least in part, on the comparison results.

2. The apparatus of claim 1, wherein the comparison logic is configured to generate the at least one pair of reference voltages that contains a first reference voltage and a second reference voltage that define the band around the integral reference voltage,
wherein the bit value corresponds to one of: a first value or a second value, wherein threshold voltages in a first range of threshold voltages are associated with the first value and threshold voltages in a second range of threshold voltages are associated with the second value, and wherein the first range of threshold voltages and the second range of threshold voltages are non-overlapping.

3. The apparatus of claim 1, wherein the memory cell is one of: a single-level cell (SLC) that stores one bit of data or a multiple-level cell (MLC) that stores two or more bits of data, and wherein the two or more bits of the MLC are read sequentially.

4. The apparatus of claim 1, wherein the comparison logic is configured to generate the one pair of reference voltages that contains a first reference voltage that is near the integral reference voltage, wherein the comparison logic functions to compare the threshold voltage of the memory cell with the first reference voltage by applying the first reference voltage to a gate of a transistor in the memory cell to determine whether current flows in the transistor, and wherein the comparison logic determines the threshold voltage is less than the first reference voltage when a drain to source current flows in the transistor.

5. The apparatus of claim 1, wherein the one pair of reference voltages that are around the integral reference voltage have fractional voltage values, and wherein the one pair of reference voltages indicate boundaries between two states associated with the integral reference voltage.

6. The apparatus of claim 1, wherein the memory cell is one cell of a word line of memory cells that are simultaneously accessed, wherein the word line of memory cells is accessed to read a word line of data, and wherein the word line of data is coded with an error correction code (ECC).

7. The apparatus of claim 1, wherein the read logic functions to determine the bit value of the memory cell that is part of a word line of data that can be decoded with an error correction code (ECC) decoder associated with a soft decoder that is one of: a low density parity check (LDPC) decoder or a turbo decoder.

8. The apparatus of claim 1, wherein the apparatus is configured to read a memory cell that stores bit values that are Gray coded, and wherein the comparison logic is configured to provide the comparison results to a soft decoder when the threshold voltage of the memory cell is between the one pair of reference voltages that define the band and to provide a bit value of the memory cell when the threshold voltage is not between the one pair of reference voltages.

9. The apparatus of claim 1, wherein the comparison logic is configured to generate the comparison results as an output to a soft decoder, wherein the comparison results are a function of the one pair of reference voltages when the threshold voltage of the memory cell is between the pair of reference voltages, and wherein the comparison logic is configured to generate the comparison results when the threshold voltage is within the band by averaging the one pair of reference voltages to use as the comparison results.

10. The apparatus of claim 1, wherein the one pair of reference voltages divide the entire cell threshold voltage range into multiple non-overlapping voltage ranges, and wherein the read logic is configured to determine a quantized value based on the comparison results.

11. A method, comprising:
reading a bit value of a memory cell by producing comparisons results from comparing a threshold voltage stored in the memory cell to one pair of reference voltages that define a band around an integral reference voltage, wherein the integral reference voltage separates different bit values in the memory cell, wherein reading the bit value includes comparing the threshold voltage with the one pair of reference voltages without comparing the threshold voltage to the integral reference voltage and wherein reading the bit value includes comparing the threshold voltage only to the one pair of reference voltages when the threshold voltage is within the band; and
determining the bit value represented in the memory cell based, at least in part, on the comparison results.

12. The method of claim 11, further comprising:
generating a page of memory, wherein the bit value is associated with the page of memory; and
forwarding the page of memory to a requesting logic that requested data from the page of memory.

13. The method of claim 11, wherein different bit values correspond to different non-overlapping voltage ranges, and wherein the one pair of reference voltages contain a first reference voltage and a second reference voltage that are different voltage values in different voltage ranges, and wherein determining the bit value is based, at least in part, on the voltage ranges.

14. The method of claim 11, further comprising:
generating a value that is provided to a soft decoder as the comparison results when the threshold voltage is within the band by averaging the one pair of reference voltages to use as the comparison results.

15. The method of claim 11, wherein comparison results are generated as a log likelihood ratio that is provided to a soft decoder when the threshold voltage of the memory cell is within the band and as a bit value of the memory cell when the threshold voltage is not within the band, and wherein the one pair of reference voltages indicate boundaries between two states associated with the integral reference voltage.

16. The method of claim 11, further comprising:
controlling the memory cell to compare the threshold voltage to a secondary pair of reference voltages that are around a second integral reference voltage to determine a second bit value represented in the memory cell, wherein the bit value and the second bit value represent bit values of different word lines of data that are independently determined using different pairs of reference voltages.

17. An apparatus, comprising:
a voltage generator to generate a pair of reference voltages that that define a band around an integral reference voltage, wherein the integral reference voltage separates different bit values in a memory;
access logic configured to perform a read operation from the memory in a flash memory and determine a voltage value represented in the memory, wherein the access logic determines the voltage value by comparing a voltage level of the memory to the pair of reference voltages without comparing the voltage level to the integral reference voltage, and wherein the access logic is configured to compare the voltage value only to the pair of reference voltages when the voltage value is within the band; and
result generation logic to produce a bit value that represents the voltage value read from the memory based, at least in part, on a result of comparing the voltage value with the pair of reference voltages.

18. The apparatus of claim 17, wherein boundaries between bit values of the memory correspond to integral reference voltages, and wherein voltage values of the pair of reference voltages are near the integral reference voltages, and wherein the pair of reference voltages indicate boundaries between two states associated with the integral reference voltage.

19. The apparatus of claim 17, wherein the result generation logic functions to quantize the voltage level of the memory to produce a quantized voltage, and wherein the result generation logic functions to generate the bit value based, at least in part, on the quantized voltage.

20. The apparatus of claim 17, wherein the memory is a flash memory cell that is a single-level cell (SLC) that stores one bit of data or a multiple-level cell (MLC) that stores two or more bits of data and wherein the access logic is configured to generate comparison results when the voltage value is within the band by averaging the pair of reference voltages to use as the comparison results.

* * * * *